United States Patent
Corbin, Jr. et al.

(10) Patent No.: US 7,425,822 B2
(45) Date of Patent: Sep. 16, 2008

(54) FUNCTIONAL AND STRESS TESTING OF LGA DEVICES

(75) Inventors: John Saunders Corbin, Jr., Austin, TX (US); Jose Arturo Garza, Pflugerville, TX (US); Dales Morrison Kent, Round Rock, TX (US); Kenneth Carl Larsen, Georgetown, TX (US); Howard Victor Mahaney, Jr., Cedar Park, TX (US); Hoa Thanh Phan, Austin, TX (US); John Joseph Salazar, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/747,216

(22) Filed: May 10, 2007

(65) Prior Publication Data

US 2007/0205758 A1 Sep. 6, 2007

Related U.S. Application Data

(62) Division of application No. 11/033,935, filed on Jan. 12, 2005, now Pat. No. 7,352,200.

(51) Int. Cl.
*G01R 31/02* (2006.01)

(52) U.S. Cl. ............... 324/158.1; 324/760; 324/765

(58) Field of Classification Search .............. None
See application file for complete search history.

(56) References Cited

U.S. PATENT DOCUMENTS

| | | | | |
|---|---|---|---|---|
| 5,977,785 A * | 11/1999 | Burward-Hoy | ............. | 324/760 |
| 6,628,132 B2 * | 9/2003 | Pfahnl et al. | ................ | 324/760 |
| 6,911,836 B2 * | 6/2005 | Cannon et al. | .............. | 324/765 |
| 6,975,028 B1 * | 12/2005 | Wayburn et al. | ............ | 257/718 |
| 7,100,389 B1 * | 9/2006 | Wayburn et al. | ........... | 62/259.2 |
| 2006/0071678 A1 * | 4/2006 | Norris | ........................ | 324/765 |

* cited by examiner

*Primary Examiner*—Minh N Tang
(74) *Attorney, Agent, or Firm*—Diana Roberts Gerhardt; Schubert Osterrieder & Nickelson PLLC

(57) ABSTRACT

Improved methods, systems, and apparatuses are disclosed for testing LGA devices. One example embodiment include vertical routing of test nest assembly cooling lines in order to minimize the test nest footprint and increase available test sites on a single test card. Another example embodiment includes isolating and adjusting external loads and moments into the heatsink/cold plate, wherein these loads and moments involve controlling the centroid to restore more ideal thermal performance of the heatsink/chip interface. Still another example embodiment includes a nest architecture facilitating easy and low-cost replacement of LGA sockets. Finally, another example embodiment includes efficient condensation control of test nest assembly parts by using dry-air exhaust.

1 Claim, 5 Drawing Sheets

FUNCTIONAL AND STRESS TESTING OF LGA DEVICES

CROSS REFERENCE

This application is a divisional application of U.S. patent application Ser. No. 11/033,935, now U.S. Pat. No. 7,352,200, entitled IMPROVED FUNCTIONAL AND STRESS TESTING OF LGA DEVICES, filed Jan. 12, 2005, the disclosure of which is incorporated herein in its entirety for all purposes.

FIELD OF INVENTION

The invention generally relates to functional and stress testing of land grid array (LGA) devices, and, in particular, to improved apparatuses, methods and systems therefor in relation to a module, which is the device under test, i.e., DUT.

BACKGROUND

Prior to installation in machines, manufacturers and assemblers, for instance, often test processor chips ("chips") to determine their performance metrics. These metrics involve investigating chip performance using functional and non-functional test sequences throughout predetermined windows, e.g., operational, for several variables, including chip voltage, clock speed, power and temperature. Although testing various chips' performance metrics readily allows for sorting these chips into their proper class of machine, testing is also used to identify chip failures, allow higher machine manufacturing productivity, and improve product quality.

LGA generically refers to interconnect technology for connecting a module, i.e., chip, to a board. From a board perspective, the board is said to have an LGA site or socket. From a module perspective, the module is said to have an LGA surface. Regardless of which perspective, the electronic connection between the module having the chip and the board is the same; that is, connection is via a conductive material called an LGA interposer. To make the temporary or permanent connection between the board and module, oftentimes there is a loading mechanism, such as squeezing, wherein the connection results. For testing environments, temporary is likely preferred because connection is for a limited time and purpose, i.e., testing. By comparison, connections in commercially available computers are often permanent.

For testing, chips are often attached to a temporary carrier, e.g., ceramic, and then placed in a device tester for testing. Before discussing testers, a brief discussion of chip testing terminology is helpful. Temporary chip attachment of a single chip is called TCA, and, it follows that the temporary carrier for the TCA is called a TCA carrier. Alternatively, the chip(s) may not be placed on a temporary carrier, but be immediately placed on its final production level carrier. In this case, the module is referred to as single chip module (SCM) or multi-chip module (MCM), depending on whether one or more chips are placed on the carrier. Upon placing the TCA, SCM or MCM into a tester, this module is understood to be the device under test, i.e., DUT. After testing the TCA, the chip is normally sheared from its TCA carrier, which is normally recycled for use as a carrier for future testing, and the chip(s) are permanently mounted on its final carrier.

Testers, themselves, include one or more chip testing components, which enable determination of chip performance metrics and their ultimate characterization. Previous testers include Early Run-In Functional ("ERIF") 3 and ERIF-4. The tester controls the applied voltage, the clock frequency, test sequences, power, and temperature. Despite differing architectures, as a whole, testers typically include: 1) a test board that is compatible with the class of DUT; 2) a control computer to control the test sequences; 3) programmable power sources, control hardware to control delivery of test resources, e.g., voltage, current, pneumatics, coolant fluid, etc.; 4) a chiller to deliver coolant fluid to the DUT; 5) network interface and communication hardware/software; and 6) a test nest, which is the portion of the tester that physically accommodates the DUT.

Despite advances in testing chips, problems and inefficiencies remain in the testers and methods used for testing modules as the DUTs. For example, nests are unnecessarily cumbersome, a problem which results in a disproportionately large nest footprint, and, thereby, seizes otherwise useable and valuable test volume; the cumbersome nest architecture also lends itself to unnecessary difficulties in installation and replacement of test sockets. In addition, testers often have external parasitic loads and moments acting on the heatsink and chip surface without having an ability to isolate and/or adjust these loads and moments; as a result, deviations from the chip's true performance metrics, especially those related to temperature, are likely to occur for the DUT. Another problem in the current state of the art is the effect of inattentiveness to controlling condensation on the DUT, wherein, condensation may cause damage to the tester.

In light of the example, above-identified problems, a need, therefore, exists, for improved apparatuses, methods and systems for testing modules as the DUT.

SUMMARY OF THE INVENTION

Embodiments of the invention generally provide methods, systems, and apparatuses pertaining to improved testing of LGA modules.

Improved methods, systems, and apparatuses generally include routing coolant lines to and from a test nest assembly in substantially vertical orientations. Such an orientation minimizes the nest footprint, and, thereby, enables test nests in a confined test volume and multiple test sites on a single test card within a test nest.

In addition, improved methods, systems, and apparatuses generally include isolating and adjusting external loads and moments transmitted to a heatsink during the testing of a module. Isolating and adjusting to the point of removal of these loads and moments assists in obtaining ideal thermal performance at the interface of the heatsink and the DUT. As a result, more ideal conditions allow for truer determinations of chip performance metrics—a primary reason for engaging in the chip testing.

Improved methods, systems, and apparatuses also generally include providing a test nest architecture that enables facile installation and replacement of low-cost LGA test sockets.

Additionally, improved methods, systems, and apparatuses also generally include improved and efficient condensation control of the test nest assembly parts through use of a secondary condensation containment chamber. The secondary chamber at least partially borders the primary chamber, which provides condensation control to the heatsink and otherwise unused dry-air exhaust to the secondary chamber.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF EXAMPLE EMBODIMENTS

The following is a detailed description of example embodiments of the invention depicted with assistance and reference to the accompanying drawings. The embodiments are examples and are in such detail as to clearly communicate the invention. However, the amount of detail offered is not intended to limit the anticipated variations of embodiments; on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, improved systems, methods, and apparatuses for testing modules, e.g., TCA, SCM, and MCM, in an LGA socket within a tester's nest section are contemplated. As a preliminary matter, although this disclosure discusses exposed chip LGA devices, it is understood that this disclosure equally applies, extends, and enables testing of lidded chip LGA device.

One example embodiment includes vertical routing of test nest assembly cooling lines in order to minimize the test nest footprint and increase available test sites on a single test card. Another example embodiment includes isolating and adjusting external loads and moments into the heatsink (also referred to as "cold plate"), wherein these loads and moments involve controlling the centroid to restore more ideal thermal performance of the heatsink/chip interface. Still another example embodiment includes a nest architecture facilitating easy and low-cost replacement of LGA sockets. Finally, another example embodiment includes efficient condensation control of test nest assembly parts by using dry-air exhaust.

Figure 1:
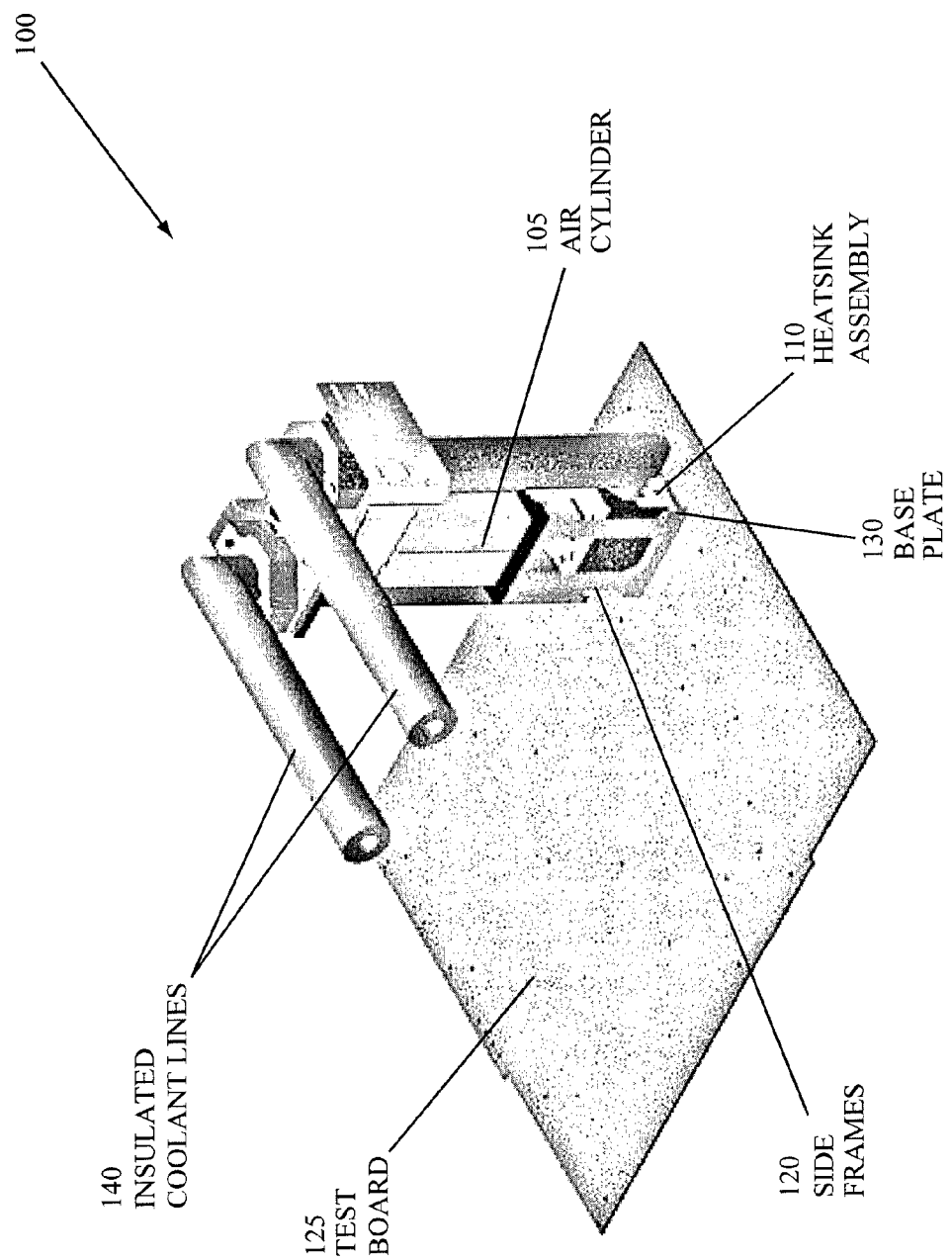
FIG. 1 depicts a test nest assembly in accordance with the disclosed invention.

Referring to FIG. 1, an example, simplified view of the test nest assembly 100 is presented. The test nest assembly 100 includes an air cylinder 105 that controls the engagement of a heatsink assembly 110, onto the exposed chip of the module. The heatsink assembly 110 accommodates a flow of chilled fluid, e.g., Dynalene®, to facilitate heat exchange between the module and the heatsink assembly 110. The heatsink assembly 110 is optionally gimbaled in order to align to the top surface of the exposed chip and create a uniform thermal path, and, thereby, enhance the ability to calculate a chip's true performance metrics. The air cylinder 105 also controls a load engagement frame that is part of the heatsink assembly that loads the module around its perimeter to actuate the LGA socket, which electrically interconnects the module to the test board 125 mounted to a base plate 130. In the operating position, the test nest is "down," which means the heatsink 110 is engaged onto the module. The air cylinder 105 can also be positioned in the "up" position to facilitate module insertion and removal. As the test nest assembly 100 traverses from the "up" and "down" positions, the coolant lines 140 routing and support structure moves with the double-ended air cylinder 105.

Figure 2:
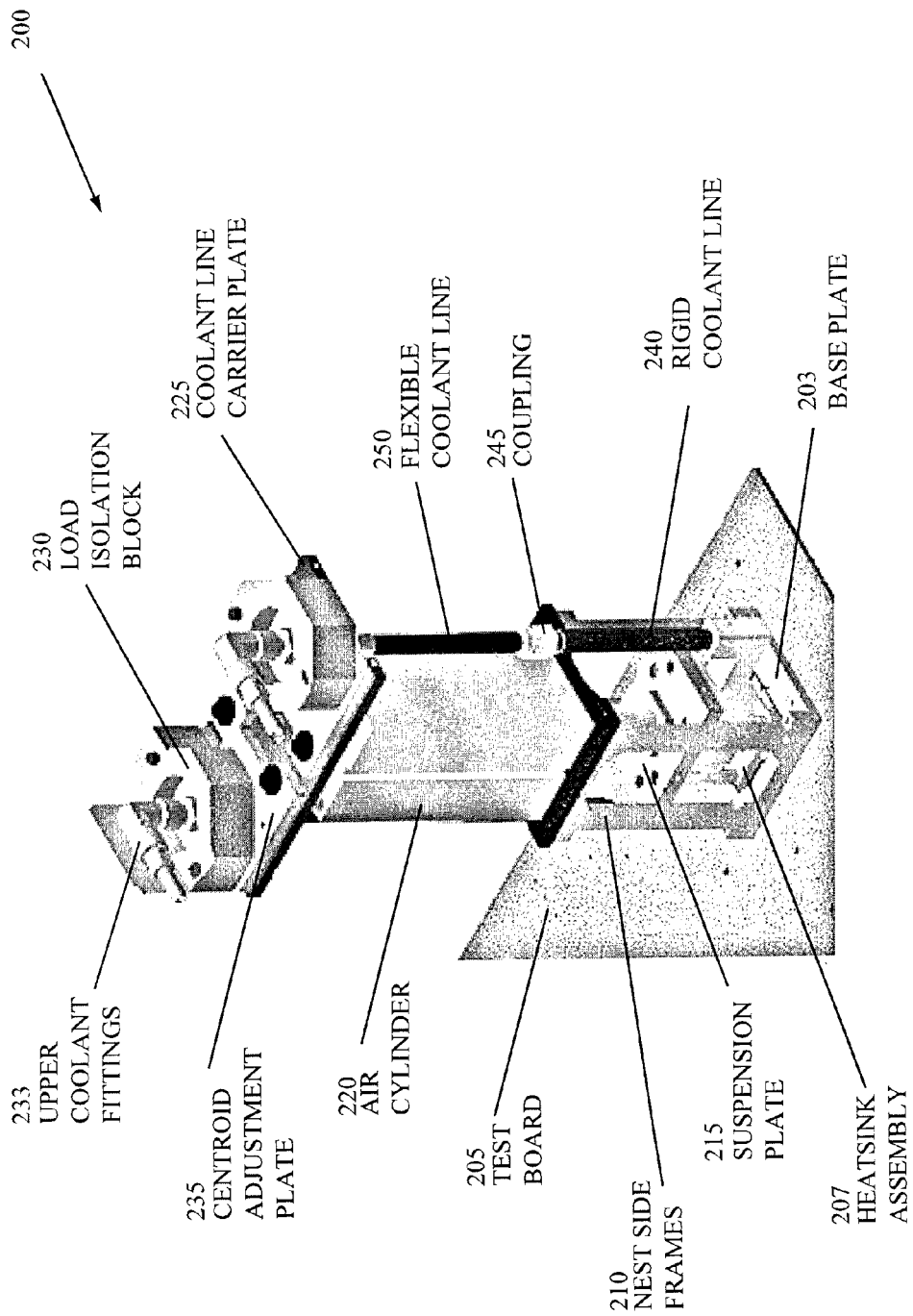
FIG. 2 depicts a detailed view of test nest assembly in accordance with the disclosed invention.

Turning now to FIG. 2, an example, detail view of the test nest assembly 200 is depicted on a base plate 203 having a test board 205. The heatsink assembly 207, nest side frames 210, and non-depicted primary containment chamber are all mounted to the suspension plate 215, which is normally rigidly attached to the moving shaft of the air cylinder 220. The air cylinder 220, in this example embodiment, is double-ended, and the coolant line carrier plate 225 is rigidly attached to the top moving shaft of the air cylinder 220. The load isolation block 230 and centroid adjustment plate 235 are also mounted on the coolant line carrier plate 225, wherein each load isolation block 230 is topped by upper coolant fitting 233. As the air cylinder 220 moves to the operational position, there is a slight, i.e., approximately 1 mm, relative motion between the heatsink 207 and the coolant line carrier plate 225 as the heatsink 207 displaces from its rest position into a suspended (i.e., on suspension springs) operational position. This relative motion must be accommodated to prevent significant compressive loads from developing in the coolant lines, each of which comprises a rigid coolant line 240 coupled 245 to a flexible coolant line 250. Such high compressive loads could also attribute to centroid deviation if they are not adequately relieved.

FIGS. 1 and 2 provide visual aid in the coolant lines' architecture, which is substantially vertical in direction as compared to the heatsink assembly having the heat sink. Verticality of the coolant lines minimizes the nest footprint, especially as compared to the ERIF-4 routing, which uses horizontal hose routing close to the board, i.e., a large footprint. In short, a minimized footprint enables test nests in a confined test volume and multiple test sites on a single test card.

Figure 3:
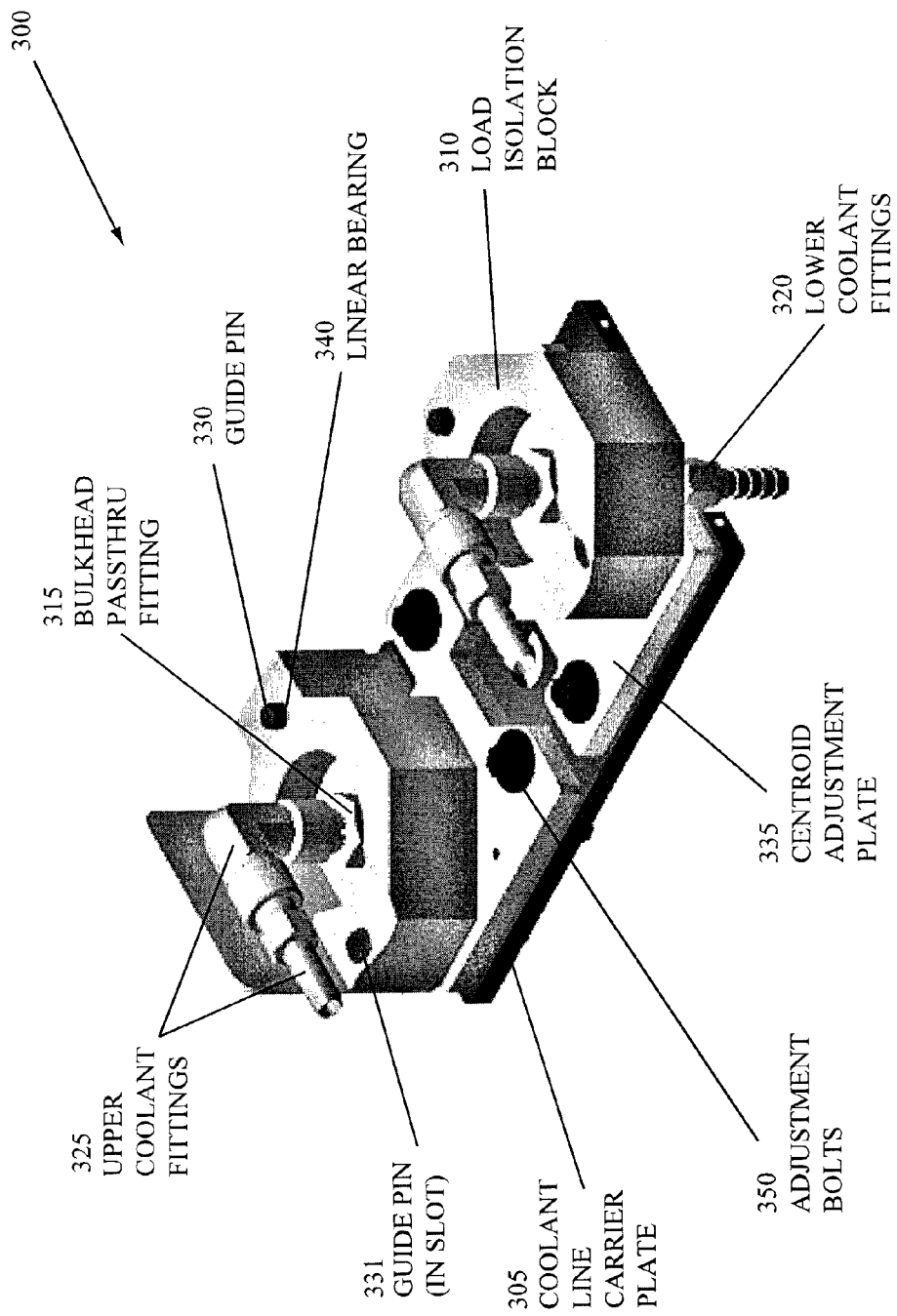
FIG. 3 depicts a detailed view of external load isolation and centroid adjustment hardware in accordance with the disclosed invention.

Moving on to FIG. 3, this figure shows additional hardware for the test nest assembly 300 shown in FIGS. 1 and 2, wherein this additional hardware 300 accommodates the relative motion of the heatsink and the carrier plate 305. The coolant lines routing from the heatsink terminate on a load isolation block 310. The load isolation block 310 may be made of Ultem® or similar low thermal conductivity material to inhibit condensation on its outer surfaces. The coolant lines are routed through the load isolation block 310 with a bulkhead fitting 315, wherein the coolant lines attach to lower 320 and upper 325 coolant fittings. The load isolation block 310 is restrained laterally by two pins 330, 331 that are press fit into the centroid adjustment plate 335, which is normally rigidly attached to a coolant line carrier plate 305 with screws for instance. These pins 330, 331 engage a hole and slot in the load isolation block 310 to restrict lateral motion. However, the load isolation block 310 is free to move vertically with respect to the coolant line carrier plate 335. This motion is facilitated by a linear ball bearing 340 that is installed in the load isolation block 310 and which engages one of the guide pins 330, 331. As the heatsink engages the module under test and moves vertically with respect to the suspension plates, this relative motion is transmitted to the load isolation blocks 310, which also respond vertically, hence eliminating any significant compressive load development in the coolant lines.

The thermal performance of the heatsink/chip interface is enhanced by a nest design controlling suspension forces and external forces acting on the heatsink so that the resultant contact force between the two is close to the geometric center—the closer the better. As the contact force deviates from true center, the contract pressure distribution between the two components will become more variable, and the thermal interface performance will degrade. Contact force centroid control is achieved primarily by using a low pivot point on the heatsink, by using low stiffness compression springs in the suspension, and by making the nominal preload compression of the springs large with respect to the deviations that would occur due to heatsink rotation during heatsink/chip surface alignment. Additionally, the external loads acting on the heatsink, primarily those relating from coolant hoses, are geometrically symmetrical, which contributes to good contact force centroid control.

Other forces, which are termed "parasitic forces" in this disclosure, can be transmitted into the heatsink, and these parasitic forces disrupt a nominally adjusted centroid, such as the one expectedly coming off the vertical architecture of the coolant lines in FIGS. 1 and 2. Parasitic forces can come from various sources to create external loads and moments. The sources include heater wires that feed into the heatsink, tubing that delivers helium to the heatsink/chip interface, insulation on the coolant lines where they enter the primary condensation control chamber, the bulk weight of the coolant lines and insulation beyond where they exit the upper coolant fittings, variations in the heatsink suspension spring loads, and a variety of other sources. Regardless of the source, these parasitic forces and moments can be nullified by applying a compensating force to the heatsink, and specifically by laterally positioning the centroid adjustment plate 335 with respect to the coolant line carrier plate 305. This translational motion develops an elastic force in the flexible coolant line 305 that connects the bulkhead fitting 315 to the rigid coolant line 240 as shown in FIG. 2. The length of the flexible coolant line 250 was selected to achieve a centroid shift of approximately 8 mm as both of the centroid adjustment plates 335 are shifted between their extremes allowed by the clearance holes and the retention bolts. The centroid is measured using a tripod load cell arrangement that mimics a module. The deviation in the loads reported by each of the load cells in the tripod can be used, along with the geometric positioning of each load cell, to compute the position of the centroid. The adjustment procedure is first to loosen the adjustment bolts 350 on both centroid adjustment plates 335, position the adjustment plates 335 until the tripod load cell reports an acceptable centroid location, and then tighten the adjustment bolts 350.

In addition to the foregoing, lateral forces and moments applied to the upper coolant fittings 325 due to the coolant hose weight or routing are not transmitted from the coolant lines connected to the lower fittings 320 because the linear bearing 340 absorbs these forces and moments. This absorbing results in a more stable centroid location over time.

Figure 4:
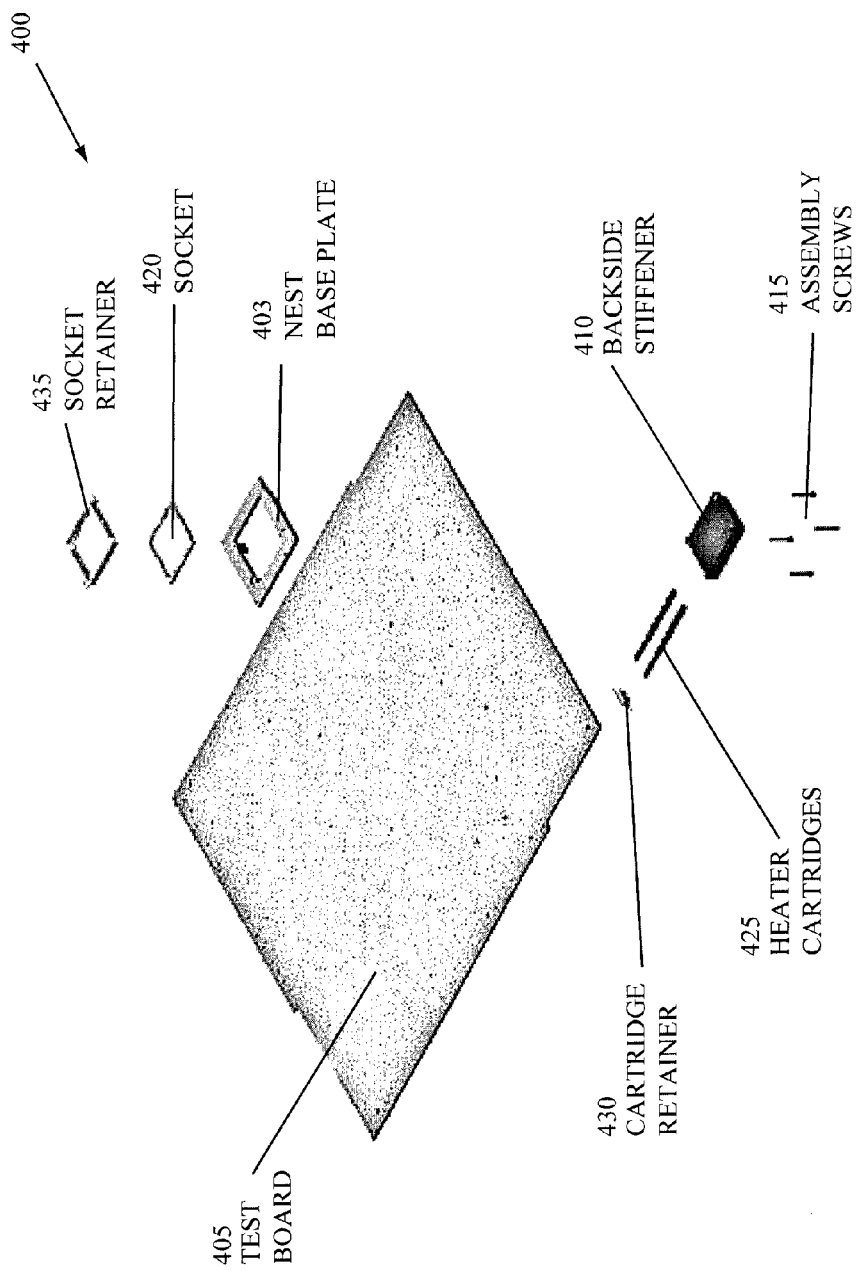
FIG. 4 depicts an exploded view of base nest assembly and backside hardware in accordance with the disclosed invention.

Now, turning to FIG. 4, an exploded view of the base nest assembly 400 is displayed. The base nest assembly 400 includes a base plate 403, which provides the structural support for the air cylinder and associated hardware. The base plate 403 is mounted to the test board 405 and is bolted to a backside stiffener 410 with screws 415, which provides the structural rigidity necessary to support the loads required to actuate LGA sockets 420. In addition, the back side stiffener 410 may also contain heater cartridges 425 retained by cartridge retainers 430, wherein the cartridges 425 warm the backside hardware to mitigate condensation.

The base assembly 400 also contains commercially available LGA sockets 420 with minor modifications to minimize their footprints, wherein the sockets 420 may be easily installed and removed from the test nest. Using low-cost LGA sockets 420 almost presuppose conditions for facilitating easy and definite need for replacing these sockets 420. These sockets 420 are retained with a socket retainer 435, which is positioned above the socket 420 to retain it in the test board 405. The socket retainer 435 is held in place by two screws on its diagonal, which facilitates its ease of removal.

Figure 5:
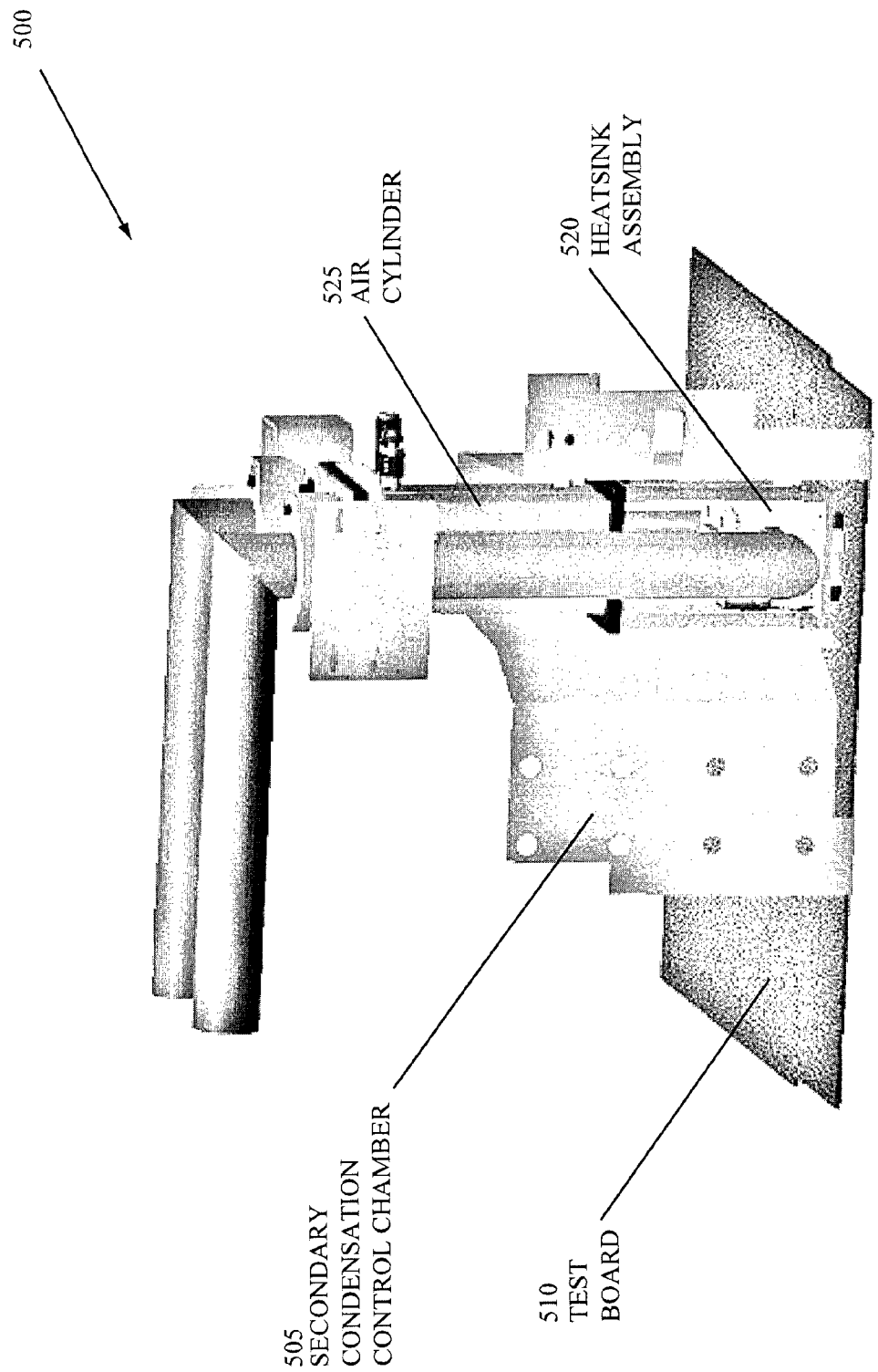
FIG. 5 depicts a test nest assembly showing secondary condensation control chamber in accordance with the disclosed invention.

Turning now to FIG. 5, this figure depicts the secondary condensation control chamber 505 of the test nest assembly structural hardware 500. The secondary chamber 505 is composed of a polymer wall that is fitted closely to the planar/printed circuit board 510 at its bottom edge and surrounds both the mechanical nest components 520, 525 and the primary condensation control containment chamber. Large air moving devices within the test unit chassis can quickly inject high moisture air into the nest vicinity. The secondary chamber 505 polymer wall acts as a barrier between inner and outer air regions. Within this barrier, components such as the base plate, side plates, and top plate supporting the air cylinder 525 each have the potential to cause condensation of water vapor due to the low temperatures driven by the roughly −20° C. coolant fluid, e.g., Dynalene®, used in the heatsink 520. This condensation is prevented by low-dew-point compressed air introduced into the primary containment area, which exhausts into the secondary containment area. The dry air pathway and condensation control is managed, for example, as follows: compressed air at dew point temperature of approximately −35° C. and dry bulb temperature of roughly 12-18° C. is injected into the primary containment chamber to control heatsink condensation. Within the primary chamber, the dry bulb temperature of the compressed air is depressed through convective heat transfer to the heatsink 520, and it exhausts from the primary chamber where the air both cools portions of the nest assembly's hardware and provides low dew point temperature air to the inner air region within the secondary condensation control chamber. The dry air mixing with the air in the inner air region lowers the inner air region dew point temperature. The outer air region outside of the secondary condensation control chamber has a maximum dew point of 13° C. Surface temperatures of portions of the nest structural hardware are below this temperature, which would cause water vapor condensation on them if they were not located within the dry inner air region. However, the dew point of the inner air region is much lower than the temperature of these hardware components, and condensation is prevented.

Condensation control is maintained in all tester components with minimum utilization of dry compressed air. If only the secondary containment condensation chamber 505 is used, and, hence, the primary chamber is eliminated, a significantly larger compressed air volumetric flow rate would be needed to prevent condensation on the heatsink 520 and the test nest assembly structural hardware 500. Compressed air is expensive to produce, and the increased dry air capacity required would increase the operating cost of the tester. Use of a primary containment chamber focused on the heatsink condensation control and a secondary chamber focused on the structural hardware is much more efficient and cost-effective use of compressed air resources and facilities.

While the foregoing is directed to example embodiments of the disclosed invention, other and further embodiments of the invention may be devised without departing from the basic scope thereof, and the scope thereof is determined by the claims that follow.

What is claimed is:

1. A method of controlling condensation in a test nest assembly during chip testing, the method comprising:

isolating, by a secondary condensation control chamber, flow of moist air from contact with the test nest assembly holding a module, wherein the moist air is used for system level cooling outside of the secondary condensation control chamber;

supplying dry air to a primary condensation control chamber; and delivering, exhaust from the dry air to the secondary condensation control chamber, wherein the secondary condensation control chamber surrounds the primary condensation control chamber.

* * * * *